US012609699B2

(12) United States Patent
Bruwer et al.

(10) Patent No.: US 12,609,699 B2
(45) Date of Patent: Apr. 21, 2026

(54) ELECTRONIC DEVICE USER INTERFACE

(71) Applicant: AZOTEQ HOLDINGS LIMITED, Nicosia (CY)

(72) Inventors: Frederick Johannes Bruwer, Paarl (ZA); Daniel Barend Rademeyer, Paarl (ZA); Landolf Theron, Paarl (ZA)

(73) Assignee: AZOTEQ HOLDINGS LIMITED, Nicosia (CY)

( * ) Notice: Subject to any disclaimer, the term of this patent is extended or adjusted under 35 U.S.C. 154(b) by 0 days.

(21) Appl. No.: 17/770,647

(22) PCT Filed: Oct. 21, 2020

(86) PCT No.: PCT/ZA2020/050058
§ 371 (c)(1),
(2) Date: Apr. 21, 2022

(87) PCT Pub. No.: WO2021/081570
PCT Pub. Date: Apr. 29, 2021

(65) Prior Publication Data
US 2022/0407515 A1      Dec. 22, 2022

(30) Foreign Application Priority Data

Oct. 22, 2019      (ZA) ................................. 2019/06932
May 7, 2020      (ZA) ................................. 2020/02508

(51) Int. Cl.
*H03K 17/95*      (2006.01)
*H03K 17/955*      (2006.01)
(Continued)

(52) U.S. Cl.
CPC ......... *H03K 17/952* (2013.01); *H03K 17/955* (2013.01); *H03K 17/97* (2013.01);
(Continued)

(58) Field of Classification Search
CPC .... H03K 17/952; H03K 17/955; H03K 17/97; H03K 2217/94036; H03K 2217/96038; H04R 1/1041
See application file for complete search history.

(56) References Cited

U.S. PATENT DOCUMENTS 3,668,697 A      6/1972   Cochran et al.
3,683,371 A      8/1972   Holz
(Continued)

FOREIGN PATENT DOCUMENTS

CN      108200490 A      6/2018
CN      106507231 B      7/2019
(Continued)

OTHER PUBLICATIONS

International Search Report of PCT/ZA2020/050058 dated Jan. 29, 2021.
International Preliminary Report dated Feb. 1, 2022.

*Primary Examiner* — Daniel C Puentes
(74) *Attorney, Agent, or Firm* — Mattingly & Malur, PC

(57) ABSTRACT

The invention concerns a robust user interface for electronic devices where a single measurement circuit is used to measured inductance values due to user press events through sealable surface, as well as capacitance values due to user proximity and/or touch events, and with both the measured inductance and capacitance values used to determine user input commands.

11 Claims, 5 Drawing Sheets

(51) Int. Cl.
  *H03K 17/97* (2006.01)
  *H04R 1/10* (2006.01)

(52) U.S. Cl.
  CPC . *H04R 1/1041* (2013.01); *H03K 2217/94036*
    (2013.01); *H03K 2217/96038* (2013.01)

(56) References Cited

U.S. PATENT DOCUMENTS

| | | | |
|---|---|---|---|
| 3,740,746 A | 6/1973 | Dureau et al. | |
| 3,757,068 A | 9/1973 | Musch et al. | |
| 4,494,109 A | 1/1985 | Bernin | |
| 4,507,639 A | 3/1985 | Trenkler et al. | |
| 4,529,967 A | 7/1985 | Gift | |
| 4,737,698 A | 4/1988 | Mcmullin et al. | |
| 4,845,429 A * | 7/1989 | Burreson | H03K 17/952 |
| | | | 324/207.2 |
| 5,331,277 A * | 7/1994 | Burreson | G01D 5/2013 |
| | | | 324/207.16 |
| 6,850,054 B2 | 2/2005 | Kjellin et al. | |
| 7,016,744 B2 | 3/2006 | Howard et al. | |
| 7,196,604 B2 | 3/2007 | Sills | |
| 7,346,397 B2 | 3/2008 | Money et al. | |
| 7,805,171 B2 | 9/2010 | Alameh et al. | |
| 7,925,029 B2 | 4/2011 | Hollemans et al. | |
| 7,944,215 B2 | 5/2011 | Howard et al. | |
| 8,009,874 B2 | 8/2011 | Brown | |
| 8,020,453 B2 | 9/2011 | Kreit et al. | |
| 8,331,603 B2 | 12/2012 | Martenson et al. | |
| 8,847,892 B2 | 9/2014 | Kreit et al. | |
| 8,854,166 B2 | 10/2014 | Furukawa et al. | |
| 8,854,309 B2 | 10/2014 | Deokar et al. | |
| 8,859,922 B1 | 10/2014 | Sage et al. | |
| 9,160,331 B2 | 10/2015 | Bakken et al. | |
| 9,209,803 B2 | 12/2015 | Bruwer et al. | |
| 9,298,289 B2 | 3/2016 | Gyurko | |
| 9,709,614 B2 | 7/2017 | Bruwer et al. | |
| 9,838,774 B2 | 12/2017 | Lee et al. | |
| 9,843,853 B2 | 12/2017 | Hirsch et al. | |
| 9,948,297 B2 | 4/2018 | Bruwer | |
| 10,237,710 B2 * | 3/2019 | Manahan | G08C 17/02 |
| 10,312,039 B2 * | 6/2019 | Ely | H01H 9/54 |
| 10,382,856 B2 | 8/2019 | Kucharko | |
| 10,444,916 B2 | 10/2019 | Unseld et al. | |
| 10,491,981 B1 | 11/2019 | Wang et al. | |
| 10,524,040 B2 | 12/2019 | Hajati et al. | |
| 10,527,457 B2 | 1/2020 | Bruwer et al. | |
| 10,779,096 B2 | 9/2020 | Balslev | |
| 10,790,824 B1 | 9/2020 | Ryu et al. | |
| 2007/0274549 A1 | 11/2007 | Husung et al. | |
| 2008/0157991 A1 | 7/2008 | Raghunath et al. | |
| 2009/0124286 A1 | 5/2009 | Hellfalk et al. | |
| 2010/0020982 A1 | 1/2010 | Brown et al. | |
| 2010/0172522 A1 | 7/2010 | Mooring et al. | |
| 2011/0007908 A1 | 1/2011 | Rosener et al. | |
| 2011/0141052 A1 * | 6/2011 | Bernstein | G06F 3/041 |
| | | | 341/5 |
| 2011/0187204 A1 | 8/2011 | Lacey et al. | |
| 2012/0314892 A1 | 12/2012 | Cheng et al. | |
| 2013/0187742 A1 | 7/2013 | Porter et al. | |
| 2014/0176159 A1 | 6/2014 | Pintiliuc et al. | |
| 2015/0042343 A1 | 2/2015 | Zibold et al. | |
| 2018/0052560 A1 | 2/2018 | Kang et al. | |
| 2018/0128650 A1 * | 5/2018 | Bruwer | G01D 5/006 |
| 2018/0324515 A1 | 11/2018 | Boesen et al. | |
| 2019/0187856 A1 | 6/2019 | Bruwer et al. | |
| 2019/0297408 A1 | 9/2019 | Saeed et al. | |
| 2019/0368238 A1 | 12/2019 | Gabriel et al. | |
| 2020/0100013 A1 | 3/2020 | Harjee et al. | |
| 2020/0166376 A1 | 5/2020 | Bruwer et al. | |

FOREIGN PATENT DOCUMENTS

| | | | |
|---|---|---|---|
| EP | 1397645 A1 | 3/2004 | |
| WO | 2004/102370 A2 | 11/2004 | |
| WO | 2007/128972 A1 | 11/2007 | |
| WO | 2008/035041 A2 | 3/2008 | |
| WO | 2018/150106 A1 | 8/2018 | |
| WO | WO-2019014690 A1 * | 1/2019 | G01D 5/2046 |

* cited by examiner

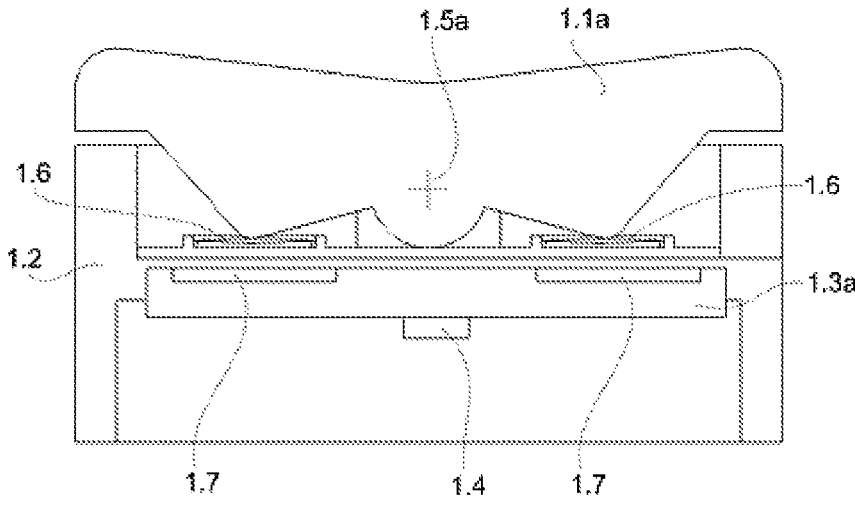
FIG. 1A
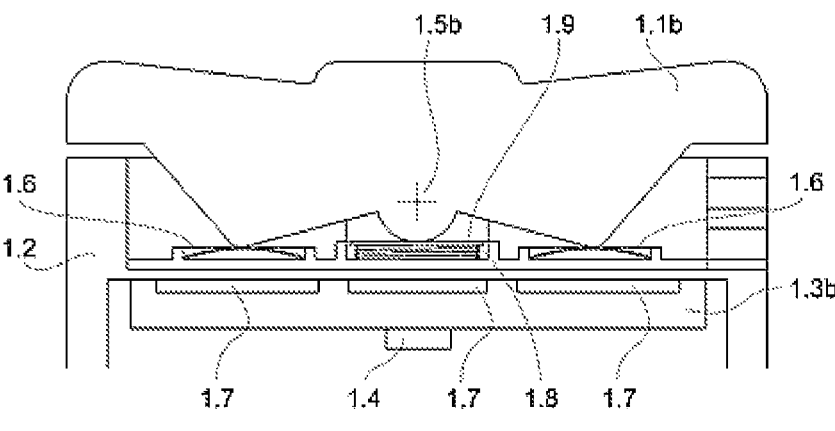
FIG. 1B
FIG. 2A

ELECTRONIC DEVICE USER INTERFACE

BACKGROUND OF THE INVENTION

Push button switches are some of the oldest, most established technology in the realm of electromechanical devices. Much innovation in the art has been dedicated to reducing mechanical wear on switch mechanisms, as well as creating a switch mechanism which may be activated while isolating the electrical components from the user interface, e.g. underwater operation.

The dominant technology in non-contact switching is capacitive sensing, and while capacitive sensing is well established in the art, there is still areas in which it is ineffective.

Inductive sensing, unlike capacitive sensing, is limited to conductive materials and ferrites, while capacitive sensing would activate in the presence of other dielectric materials too (e.g. water).

The prior art contains a fair number of disclosures on buttons and switches that utilize inductive sensing or related methods. Some of these are described below.

U.S. Pat. No. 10,312,039 by Ely et al teaches a waterproof induction pushbutton, wherein a moving magnet induces current in a coil, used with capacitive sensing in an electronic device. Activation of the induction button causes device wake-up, after which capacitive sensing may be performed. This is based on the induction button not consuming power, but rather generating it with said magnet. The '039 patent further teaches use of the induction button in a wearable device, for example a watch.

U.S. Pat. No. 8,020,453 by Kreit et al teaches a rotating pushbutton structure located above an impermeable fascia, with a conductive member which may be pressed by a user towards the fascia to cause pushbutton activation, with inductive sensing through the fascia used to detect said press action.

U.S. Pat. No. 7,196,604 by Sills et al teaches a hermetically sealed pushbutton which pushes a ferrite rod, or a rod comprising multiple ferrite sections, through a number of transmitter and receiver coils to facilitate button detection via changing mutual inductance between the coils.

U.S. Pat. No. 8,847,892 by Kreit teaches a structure with a conductive member located underneath a cover, and which moves closer to a coil when pressed by a user. The conductive member and cover may be the same member according to Kreit and may comprise a flat layer or be arcuate in form. A large number of applications are listed by Kreit, including pushbuttons, rocker buttons etc. The '892 patent also teaches the use of a beam-like structure to mechanically amplify movement of a user to cause a conductive target to move over a greater distance towards a coil used for sensing.

In US20110187204 by Lacey et al, a prior art inductive touch key is presented which use a conductive target attached to a fascia, wherein the target is pressed by a user to move closer to a coil to cause key activation. Lacey et al further teaches a number of related inductive sensing key or switch structures, including a dome shaped conductive target.

U.S. Pat. No. 7,016,744 by Howard et al teaches the use of inductive sensing coils to determine the positions of buttons, sliders, pucks and knobs through a sealed surface such as those found in domestic appliances.

In U.S. Pat. No. 3,668,697 Cochran et al teaches a non-contacting keyboard that uses keys comprising ferrite members, wherein a key press causes an increase in mutual inductance due to movement of the ferrite member. Cochran et al also teaches that the ferrite members could be exchanged for metal to cause a decrease in mutual inductance when a key is pressed.

U.S. Pat. No. 10,527,457 by Bruwer et al teaches a number of inductive sensing switches or buttons. Amongst these is a double action dome switch wherein metal moves closer to a monitored coil when the dome is pressed to first enter a deformed and then a snapped-through state, with said coil and the sensing circuit for it contained within a sealed housing. The '457 patent also teaches that the dome and metal member may be one and the same. It further includes switch embodiments where a user press on metal members located outside a sealed housing with gas or liquid pressure around the metal members equalized.

In US20200166376 Bruwer et al teaches a number of inductive sensing user interface structures that combine rotary knobs and pushbuttons, and wherein apertures in a conductive layer are used to facilitate sensing through the conductive layer.

US20190187856 by Bruwer et al teaches a number of inductive sensing button and switch structures. A number of these alternately have a conductive material and a magnetic material target in proximity to a sensed coil or coils, with the inverse change in sensed inductance due to the two different material types used to increase the robustness of button or switch activation detection. It also teaches the use of latching mechanisms in inductive sensing switches or buttons. In addition, the '856 application includes use of a rocker type switch with two sensing coils to realize differential inductance signals for discerning switch activation. The coils may be located inside a sealed housing, with the moving parts located on the outside. It is also taught that a conductive member may be used to influence one of the coils and a magnetic material member the other coil, instead of two conductive members or two magnetic material members.

Use of inductive sensing for wear detection in wearable audio devices such as headsets, earphones, earbuds, and hearing aids are well represented in the prior art. For example, Raghunath et al taught use of an inductance sensor to detect wearing of a pair of headphones by a user in their US20080157991.

In U.S. Pat. No. 7,805,171 Mohsen et al teaches a hook type earpiece that use a proximity sensor to decide when to switch on/off or perform other functions, where the proximity sensor can also be an inductive sensor, amongst others. Use of an inductive proximity sensor in a headset ear hook to detect wear state is also taught by Brown in U.S. Pat. No. 8,009,874.

U.S. Pat. No. 9,838,774 by Lee et al teaches an in-ear headset in the form of an earplug that comprises a generator coil and a sensor coil, wherein the magnetic field generated and sensed is used to perform inductive proximity sensing of a user.

U.S. Pat. No. 10,382,856 by Kucharko teaches an earphone that clips onto a user's ear, with inductive proximity sensing used to monitor levers of the clip for detection of a non-wear state, with subsequent device turn-off.

In U.S. Pat. No. 10,491,981 by Wang et al, a hearable device that utilizes an inductive proximity sensor is taught, with the device which can be any one of an in-ear, on-ear or over-ear electronic audio device. And in U.S. Pat. No. 10,524,040 Hajati et al teaches use of sensors in headphones to gather data from a user, with inductive proximity sensors listed as one of a number of sensor types which may be used.

In US20090124286, with a priority date of 2007, Hellfalk et al teaches earpieces with a sensor for sensing earpiece status, i.e. in-ear or out, and accordingly controlling audio playback. They state in a fair number of instances that the sensor may sense inductance, amongst other possible parameters.

Brown et al in US20100020982 teaches yet another earbud with an inductive proximity sensor to detect don/doff status for controlling media playback accordingly, as well as detection whether one or both earbuds are inserted. Wearable audio devices that use inductive proximity sensors are also taught in US20100172522 by Mooring et al, in US20110007908 by Rosener et al, in CN108200490 A by Song et al and in CN106507231 B by Wenxuan et al.

The prior art also contains a number of entries teaching that inductance sensing may be used to facilitate user input for earphones, earbuds, headphones, hearing aids or the like. In U.S. Pat. No. 8,331,603 Rasmus et al teaches a headset with ear hooks and a movable boom, wherein a sensor is located in the boom to sense user interactions such as touch and force applications. Rasmus et al states that the sensor can be a touch sensor such as a capacitive or inductive sensor.

In U.S. Pat. No. 7,346,397 Money et al teaches an implantable hearing aid with an implanted resonant circuit coil, wherein a wearer may control the aid by bringing a metal object close to an implanted coil.

US20070274549 by Hunsung teaches a hearing apparatus which comprise a coil, where current in the coil is measured and used to control the apparatus, for instance complete switch-off or volume control. The hearing apparatus may be any of a hearing device, a headset, headphones etc. An oscillating LC-circuit is moved further and closer to said coil to control the apparatus.

In US20120314892 by Cheng et al, a hearing apparatus with a movable battery compartment is taught, wherein a sensor is used to monitor the position of said compartment in a non-contact manner based on inductive detection. A user may move the battery compartment between two positions to switch the device on and off.

U.S. Pat. No. 10,779,096 by Balslev teaches a hearing device with an implanted receiver coil. An external transmit coil is coupled to the receiver coil, with the distance between the two monitored by measuring a coupling coefficient and used to decide when to enter a sleep or off mode.

In U.S. Pat. No. 10,790,824 by Ryu et al, both inductive and capacitive sensing is used in a manner to discern whether a user or a metal object interacts with a button. An oscillating LC-circuit and frequency counting with slope detection is used to discern whether an engaging object cause a measurable change in capacitance or inductance. The '824 patent teaches use of such combined capacitive and inductive sensing buttons in wireless headsets or earbuds, amongst other applications.

The prior art also contains a number of instances where the use of the same electrodes for inductive and capacitive sensing is taught. For example, in U.S. Pat. No. 10,527,457 Bruwer et al teaches headphones and tablet computers that utilize the same coil structure for both capacitance and inductance measurements. And in U.S. Pat. No. 9,160,331 Bakken et al teaches use of the same electrodes for capacitive and inductive sensing with switches to configure the electrodes for the particular sensing mode.

However, the prior art fails to provide a solution to the problem of portable electronic devices, specifically wearable electronic devices such as wireless audio electronic devices, needing a simplistic yet robust user interface to enter commands in a range of environments. That is a user interface which allows the user to engage with said device in a simplistic yet definite manner, without erroneous activation of functions due to environment changes and without an undue increase in cost and complexity. For example, if a user interface relies solely on capacitive sensing, water or metal in proximity to the sensing electrodes may cause false activation of device functions. Conversely, if the user interface relies solely on inductive sensing, a number of environmental factors can cause erroneous operation of the interface, e.g. metal objects, magnetic material proximity or magnetic fields. The above citation by Ryu et al teaches buttons etc that perform both inductive and capacitive sensing, but only to discern the type of object engaging a device. In other words, Ryu et al teaches a capacitive interface for user interaction and an inductive interface for non-human interactions, e.g. with metal objects. Ryu et al fails to teach a user interface where a human body or appendage alone may cause both a capacitive change and inductive change in combination and in such a manner that it provides both simplicity and high detection robustness for the portable electronic device.

SUMMARY OF THE INVENTION

In an effort to clarify the disclosure of the present invention, the following description is presented. This should not be construed as limiting to the claims of the invention, with more embodiments potentially existing than what is described in the following and which fall within the spirit and scope of the invention.

The present invention aims at creating a switch interface that is electrically isolated from the sensing electronics and has greater range of usable environments.

Deformation of a flexible conductive element (e.g. plate, snap-dome, etc.) above a current carrying coil changes the mutual inductance between the flexible conductive element and the coil. This change in current may be sensed by a current sensor (or similar such sensor, e.g. current-to-voltage conversion while sensing the voltage).

The flexible conductive element discussed in the embodiments is not limiting as the deformable element may be any material which couples via mutual inductance to the coil and which may deform relative to the coil or, change its projected shape relative to the coil. This is to say, that a ferrite block (electrically non-conductive) rotating or translating above may also be a suitable element. E.g. thin ferrite sheet on sponge or spring member.

Any mechanism using an elastically deformable mechanism (e.g. springs, snap-domes, flexible housing element) which returns to a stable rest position may be suitably modified to operate on these inductive sensing principles, utilizing either conductive material (e.g. metal) or ferrite.

Because the flexible conductive element need not be electrically connected to the sensing circuitry it may be positioned apart, separated and insulated from the sensing circuitry, this may allow for the switch to operate underwater: where the sensing electronics may be in a suitable sealed housing and the flexible conductive element and its deformation mechanism may be outside of the sealed housing.

Given the nature of inductive sensing, the presence or lack there-of, of a conductive element may be seen as an event, in addition to the level of deformation of the conductive element. In this way an embodiment of the invention can be such that the switch may only change state when the conductive element is present.

With the button mechanism electrically isolated from the sensing structures, the electrical components may be made waterproof, while the button mechanism may be operable underwater. With the button mechanism immersed in the water, the problem of differential pressure activating the button may be negated.

Removable, insulated control buttons may make cleaning surfaces easier, for example: stove-tops and other kitchenware.

An even more robust or secure switch may be constructed using both ferrite and metal that affects two separate inductive sensors (in a single push button switch) when the switch is actuated by a user. This is due to the fact that ferrite affects the inductive measurement in an opposite direction than a metal material. If measurements do not show these differentially separating characteristics, then no switch activation may be triggered.

In a further embodiment, the member affecting the inductive measurement element may be a cylindrical staff (rod) made of ferrite and metal. The combination may be arranged to press through the sensing element (e.g. coil) in a way that at one stage of the actuation the ferrite is inside the measurement coil and when pressed further the metal may come inside the inductive measurement coil. This operation could allow for a very clear position where a decision may be made that the switch has been activated.

The dome plate mechanism is convenient as it is very well used technology, generally freely available at low cost with well-defined specifications such as pressure required for snap, number of operations, available in various sizes and shapes and it gives a tactile feel. Additionally, the snap has a sharp movement which may clearly affect the inductive measurement. However, the tactile feel may also be provided by the housing construction similar to what is found in many writing pens. This may be used for push to make and/or latching switches without requiring a dome plate element.

The present invention may also advantageously be embodied in user interfaces for various electronic devices, for example in a user interface for audio playback equipment. Using inductive sensing may enable realization of audio playback equipment with a robust and waterproof user interface, e.g. for an earphone or earbud used to enjoy True Wireless Sound (TWS). Such TWS earphones are typically inserted in a user's ear and may require an interface which is intuitive to use, considering that users typically cannot see earphones when interacting with them. The interface should also be robust and not false trigger. Embodiments of the teachings of the current invention may be used to realize such interfaces, for example by using inductive and capacitive sensing circuits and structures are disclosed in the preceding and following.

In an exemplary embodiment, an electronic device such as an earphone may utilize a coil, or another conductive member, to monitor a push button structure, wherein said push button may be located on the outer side of an enclosure that contains said coil. The enclosure may provide sealing against ingress of solids, liquids or gasses, for example it may provide sealing against water ingress. Circuitry used to measure the relative or absolute inductance of the coil to facilitate said monitoring may also be located inside said enclosure. The push button structure may utilize a conductive member to cause a change in said measured inductance when it is pressed. For example, the push button structure may be fashioned out of a compliant rubber like material, and have a flexible conductive member attached to its bottom face. When a user presses with enough force onto the push button structure, it may flex towards the coil, thereby bringing the conductive member closer to it. This may cause a measurable change in coil inductance due to increased eddy current losses. In this manner, the electronic device may provide a user interface requiring a definite press by the user to enter a command. The conductive member may also be exchanged for a member fashioned out of ferrite, or another magnetic material, according to the present invention. In addition, the push button structure may alternatively make use of a metallic snap dome, as is well known in the art of electronics, to give tactile feedback to a user. For example, a typical metallic snap dome may be located on the outside of said enclosure, with a rubber or plastic member over it. When a user presses down with sufficient force on said rubber or plastic member the snap dome may snap towards said coil, while giving tactile feedback to the user that the push button has been activated. Due to said snap, the metal of the snap dome may move closer to the coil, which may cause a measurable change in coil inductance. This change in inductance may be used to detect the activation of the push button structure. Advantageously, with the snap dome located on the outside of the enclosure, the electronics of the electronic device may be sealed inside the enclosure against liquids, solids and gasses.

In the above exemplary embodiment, said circuitry used to measure the inductance may utilize charge transfer methods and structures for said measurement. In addition, the circuitry used for the inductance measurement, or other circuitry, may also be used to measure absolute or relative capacitance of the coil, or of another member or members. This may further improve the user interface robustness and functionality of said electronic device. For example, the capacitance of a plurality of distinct conductive structures, located inside said enclosure, may be measured by the same circuitry used for said inductance measurements. This may be used by the electronic device to determine whether an object, for example a user's finger, is within proximity of or touching said enclosure, which may then be used to allow or negate the one or other function or action by said electronic device. For example, the electronic device may also monitor the capacitance of three distinct, metal structures used to form a slider and/or swipe interface, as is well known in the art.

Further, in the above, said coil or one or all of said distinct conductive structures may also be used for other purposes, such as radio antennas to facilitate radio communication. The present invention teaches that a singular conductive structure, or a plurality of conductive structures, within an electronic device such as a TWS earphone may be used to measure inductance, capacitance and to communicate via the one or other radio frequency, for example frequencies used by Blue Tooth Low Energy (BLE®). Such a conductive structure(s) may be fashioned in a manner which allows the electronic device to not only sense a user press on one side of an enclosure using e.g. inductance measurements, but to also sense user touch and/or proximity events on said side or another, e.g. opposing, side of the enclosure. For example, a TWS earphone or earbud may embody the present invention by having a printed circuit board with a coil structure thereon contained within its enclosure, wherein circuitry in or associated with said earphone may measure the inductance of the coil as well as capacitance of two metal structures also located in the earphone enclosure, with said capacitance which may be used to discern user touch and proximity events. One or both of the metal structures may also be fashioned such that a user may press them via said enclosure to cause a decrease in the gap between the metal structure or structures and said coil structure, causing a change in the measured inductance. This may be used to discern a user press input or inputs. In addition, one or both of the metal structures may also be used as Blue Tooth®
antennas for radio communication.

In another exemplary embodiment, a conductive structure
may be located over a coil, wherein a user may influence the
spacing between the conductive structure and the coil to
interface with an electronic circuit. Said conductive struc-
ture may be fashioned such that it may mechanically amplify
or reduce the change in distance affected by the user. For
example, the user may press down on a first part of said
conductive structure, thereby causing a first change in dis-
tance between the first part and a first reference point. In
addition, due to the design of the conductive structure, said
first change in distance may also cause a second change in
distance between a second part of said conductive structure
and the coil, with said second change which may be sig-
nificantly larger or smaller than said first change. The second
change in distance may be used to discern a change in the
measured inductance, or other parameter, of said coil, which
in turn may be used by the electronic circuit to determine
user intent.

Naturally, in the above, said conductive structure may
also be exchanged for a structure fashioned out of the one or
other magnetic material, without departing from the teach-
ing or scope of the present invention.

The aforementioned disclosures will be described in more
detail in the following sections and must not be construed as
limiting to the scope of the invention.

BRIEF DESCRIPTION OF THE DRAWINGS

The invention is further described by way of examples
with references to the accompanying drawings in which:

FIG. 1A shows an exemplary Rocker Switch utilizing two
such coil-plate pairs.

FIG. 1B shows a modification to the Rocker Switch
include a coil-ferrite pair and create a tri-state switch.

FIG. 2A shows a momentary push-switch which may be
waterproof.

Figure 2B:
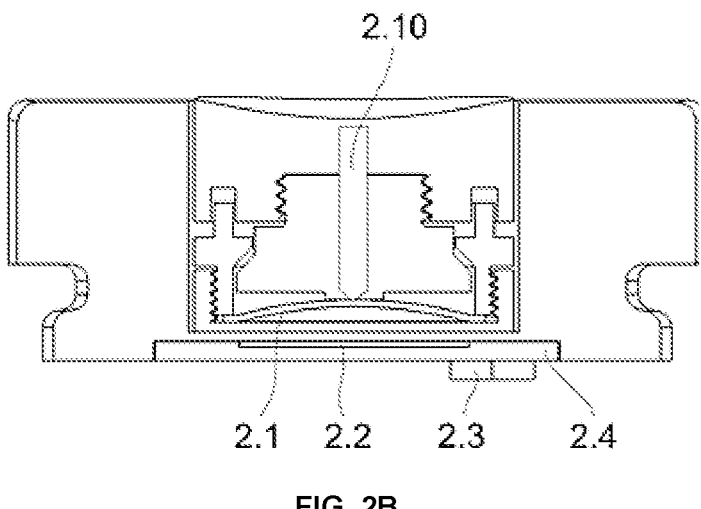
FIG. 2B shows a modification to the deformation mecha-
nism so as to enable additional capacitive sensing.

To further clarify the disclosure of the present invention,
the following descriptions relating to the appended drawings
are presented. These should not be construed as limiting to
the claims of the invention and are merely used to support
clarity of disclosure. A large number of alternative embodi-
ments may be possible that still fall within the spirit and
scope of the present invention, as may be recognised by one
skilled in the relevant arts.

In the first embodiment, as drawn in FIG. 1A, inductive
coil structures 1.7 on a PCB 1.3a with sense IC 1.4 may be
inside a housing 1.2. Aligned above the inductive coil
structures 1.7 may be flexible conductive plates 1.6—the
deformation of these plates may change the nature of the current flowing in the inductive coil structure, which may be
detected by the sense IC 1.4, in this way interactions (e.g.
presses) may be detected.

Further, the embodiment may utilize two such coil-plate
pairs 1.6 & 1.7, and a see-saw rocker structure 1.1a which
may rotate about a centre 1.5a such that only one coil-plate
pair may be momentarily depressed at a time.

Given the nature of ferrite to increase the mutual induc-
tive coupling, as opposed to conductive metals which gen-
erally reduces the mutual inductive coupling, in the rocker
switch embodiment using two sensors: one of the sensors
may be metal and the other ferrite. The rocker action may
then create a differential signal that may have greater signal
to noise ratio and increased immunity to temperature effects.

In a modification to the first embodiment, shown in FIG.
1B, the PCB 1.3b may include a third additional inductive
coil 1.7, below a ferrite plate 1.9 mounted on a spring 1.8.
The ferrite-coil pair may be aligned directly below the
rocking centre 1.5b of the modified button rocker 1.1b. The
rocking centre 1.5b may be modified such that it may also
translate such that pushing down on the middle of the button
1.1b may translate the rocking centre 1.5b such that the
spring 1.8 compresses and the ferrite plate 1.9 may move
towards the coil 1.7. Because of the ferrite plate 1.9 the
signal may be easily differentiated from that of the conduc-
tive plates 1.6. Temperature effects may be accounted for as
the signals in the two conductive plates 1.6 should change in
the same direction, this may be differentiated from a centre
push because of the way the ferrite plate 1.9 should affect the
coil 1.7 associated with it.

In the second embodiment, as drawn in FIG. 2A, the
flexible conductive plate 2.1 may be held in place by a lower
support 2.9 and upper support 2.6. The push button 2.7 may
push down on the flexible conductive plate 2.1 through the
button post 2.8. The button post's movement may be limited
by the upper support 2.6 and the flexible conductive plate
2.1. The whole push button and flexible conductive plate
with support structures 2.6, 2.7, 2.8, 2.9, 2.1 may be
removed from the housing 2.5. The presence of conductive
material may be detected, and the interaction (e.g. deforming
the material relative to the sensing coil) may also be
detected. The push-button mechanism's support structures
2.6, 2.7, 2.8, 2.9, 2.1 are merely part of the example
hardware and not integral or limiting to the invention and
serve merely to illustrate one of many ways in which a
waterproof switch may be implemented.

While inductive sensing overcomes some of the environ-
mental drawbacks of capacitive sensing, for a given appli-
cation, it may be beneficial to have an inductive switch that
includes capacitive sensing. For example, proximity detec-
tion may be used to illuminate the switch so that the user
knows where to press. To this end, a modification to the push
button which deforms the conductive plate is show in FIG.
2B, here a conductive insert 2.10 may be secured inside the
switch elements. The conductive insert 2.10 may still be
electrically isolated from the user and from the sense-circuit
2.2, 2.3, 2.4, but may be electrically connected to the flexible
conductive plate 2.1. In this way, capacitive coupling from
the user to the conductive insert 2.10 may be transmitted to
the flexible conductive plate 2.1 where it may be sensed
from an additional capacitive sensing electrode or the coil
2.2 being used a capacitive sensing electrode with sensor or
sensor IC 2.3.

In this way, capacitive proximity detection may be used,
for example, to wake the sensors from a low-power sleep
state when the user is close enough to begin activating the
inductive switch.

To augment the spring-type action a latching mechanism could be implemented, creating for example a traditional ON-OFF switch which when pressed latches and remains in the position until released by a subsequent press.

Figure 3:
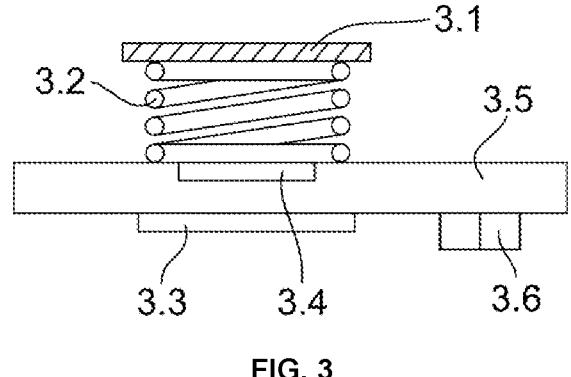
FIG. 3 shows a biased push button.

In FIG. 3, a conductive plate 3.3 is placed below a coil 3.4 on a PCB 3.5. This may bias the signal detected by sensor or sensing IC 3.6. Above the coil 3.4 on a spring 3.2 may be a plate of ferrite 3.1. Depressing the ferrite plate 3.1 towards the coil 3.4 may increase the mutual inductive coupling, which may already be biased by the conductive plate 3.3 below the coil 3.4 on the underside of the PCB 3.5. In this method, a constant reference may always be established on the sensor 3.6. This may make the system immune to the presence of conductive materials in the working environment, e.g. placing the device comprising the inductive switch on a metal surface. It is also noted that the roles of the ferrite plate and the conductive plate may be reversed, such that the ferrite plate is always biasing the coil.

Figure 4:
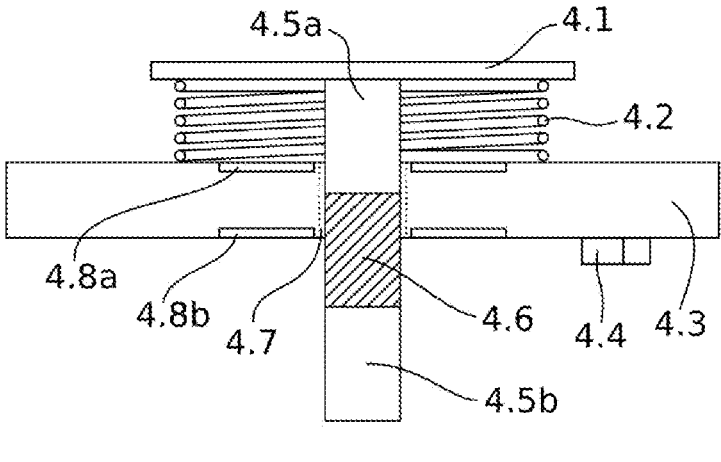
FIG. 4 shows a push button implementation using ferrite
and metal rod.

Again, using the difference between ferrite and metal, an example of a push button switch utilizing a rod mechanism is illustrated in FIG. 4 where in a plunger 4.1 may be connected to a rod made of one or more alternating conductive sections 4.5a & 4.5b and ferrite element 4.6. With the assistance of a spring 4.2 or similar mechanism, the rod may be translated through a hole 4.7 in the PCB 4.3 away from a rest position by pressing the plunger 4.1 and compressing the spring 4.2. The hole 4.7 may be located in the middle of one or more inductive sensing coils 4.8a & 4.8b, the passage of the ferrite 4.6 or conductive 4.5 elements through the coils 4.8 should change the nature of the signal sensed by the sensor or sensing IC 4.4. Having an element always in place while in the rest position means that there should always be a defined reference signal for the system to use. And, by implementing more than one coil, the system may use differential signals to remove environmental effects (e.g. temperature, etc.).

Figure 5:
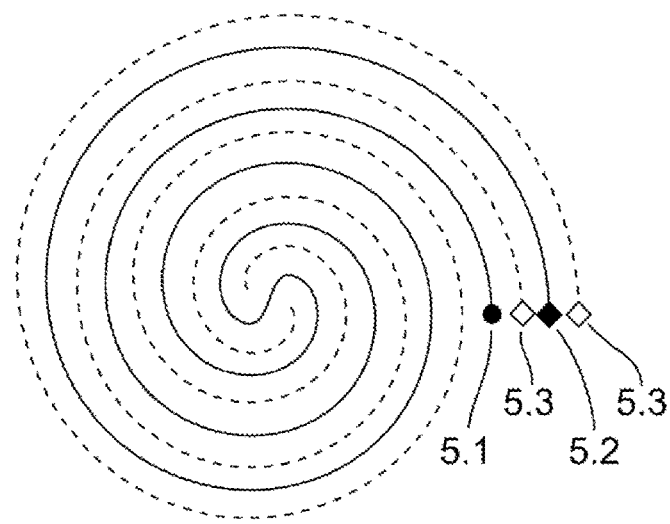
FIG. 5 shows a coil configuration which reduces the
capacitive effects during sensing.

FIG. 5 illustrates an inductive coil which is between an input signal (TX) 5.1 and sensing port (RX) 5.2. Typically, when conductive material or ferrite is brought closer, the mutual inductance between the material and the coil may change the nature of the current flowing in the coil, and this may be sensed. However, when the coil's windings become numerous and tight, the capacitive coupling between the windings of the coil may become significant enough that capacitive interaction with the coil (e.g. human finger) may influence the capacitive coupling sufficiently so as to create a detectable change in the current. To reduce this, additional traces (shown in dashed-lines) may be included between the traces of the inductive coil. These are connected to Ground 5.3, but do not form a closed path for current to flow, and as a result only capacitive coupling may be formed to ground. This capacitive coupling may be significantly stronger, and as a result any additional capacitive interaction with the coil (e.g. human finger) should not be strong enough to influence the coil.

Figure 6A:
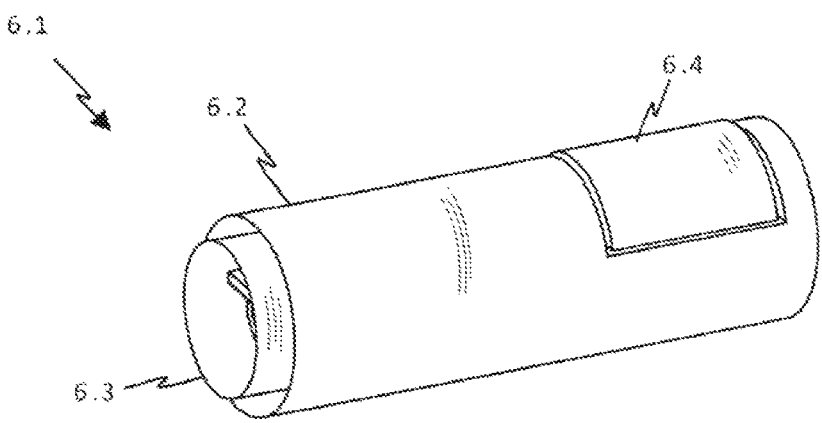
FIG. 6A-6C shows an exemplary embodiment in the form
of the stem of a TWS earphone.
Figure 6A:
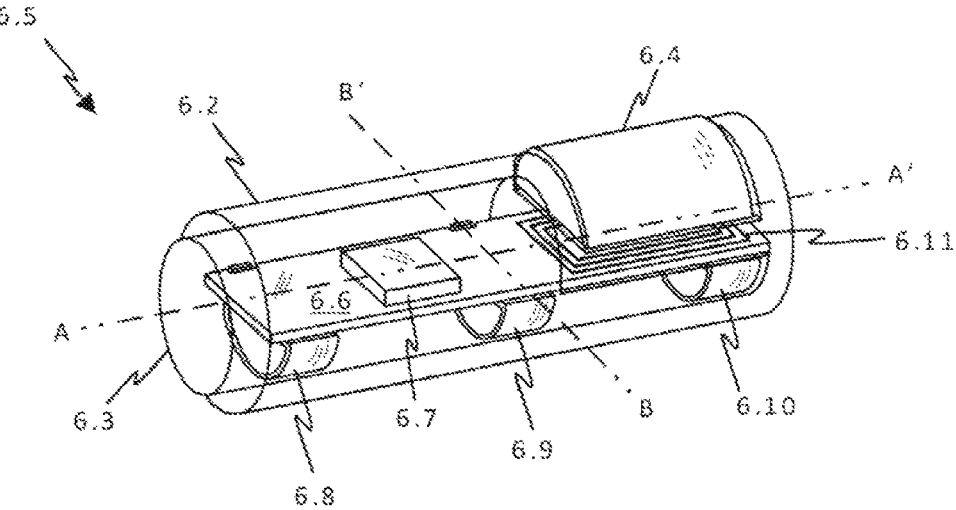

FIG. 6A shows a part of an electronic device which embodies the present invention, for example a stem 6.2 of a TWS earphone or earbud at 6.1. The stem enclosure may typically contain an inner enclosure such as that shown by 6.3, which may be used for sealing or to contain and locate electronics within the earphone. A user may interface with the electronic device via a push button 6.4. Inductive sensing circuitry may be used to monitor push button 6.4. To better describe the embodiment of FIG. 6A, stem enclosure 6.2 and inner enclosure 6.3 are drawn as transparent objects at 6.5 and a cross-sectional view along AA' is provided at 6.12 in FIG. 6B. As shown, a substrate, such as a printed circuit board, 6.6 may be located within inner enclosure 6.3, with a coil structure 6.11 located on the substrate. For example, coil structure 6.11 may be fashioned out of etched copper tracks, as is known in the art. A circuit 6.7 may be used to measure the inductance of coil 6.11, for example using charge transfer techniques and circuitry. Push button 6.4 may be fashioned out of pliant material such as rubber or the one or other elastomer. A conductive member 6.13 may be placed on the bottom face of push-button 6.4. When a user presses onto the push button, it may deflect causing conductive member 6.13 to come closer to coil 6.11, which may cause a measurable change in the inductance of said coil. For example, such a change may be used to discern a user press event on the stem of a TWS earphone. Naturally, as would be perceived by those skilled in the art, the present invention is not limited to the use of a conductive member for 6.13, as it may also be a magnetic member, for example a ferrite member. In addition, the present invention is not limited to the push button structure depicted but may use any of the aforementioned structures described by this disclosure, or others. For example, it may use metallic snap domes, which is well known in the art. The push button structure may also be located within the outer enclosure 6.2 or inner enclosure 6.3 and may be pressed by the user through said enclosures, without departing from the teachings or scope of the present invention.

Also evident from the depictions at 6.5 and 6.12 are half-circle or round members 6.8, 6.9 and 6.10, located on the bottom side of substrate 6.6. These may be conductive members which may be connected, either directly or via an isolation barrier, to circuit 6.7 which may measure the capacitance (self-capacitance or mutual-capacitance) for each member or for combinations of the members. Said capacitance measurements may be used by circuit 6.7 or another circuit to discern user proximity and touch events. For example, conductive members 6.8, 6.9 and 6.10 may be used to form a slider or swipe structure, wherein a user input via touch or proximity may only be declared or annunciated if a specific sequence of changes in the capacitance measured for said members is detected, as is known in the art of capacitive sensing.

Figure 6B:
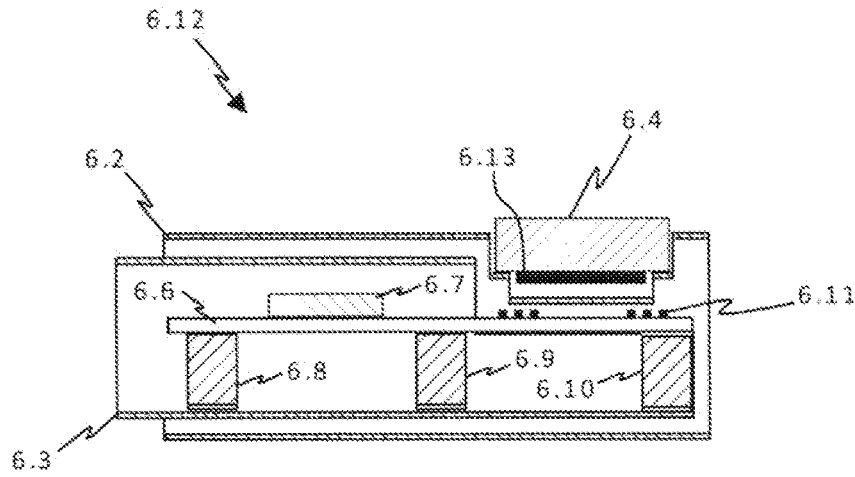
Figure 6C:
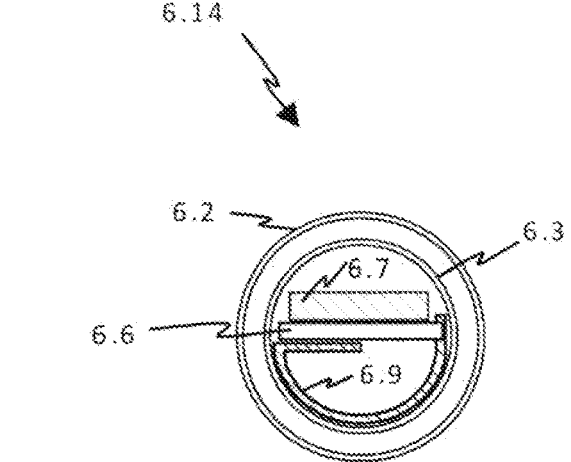

According to the present invention, an embodiment as depicted in FIGS. 6A, 6B and 6C may be used to provide an intuitive and robust user interface for an electronic device such as a TWS earphone. For example, a specific user command may require a specific sequence of a user press action or actions on push button 6.4 and touches or proximity events on conductive members 6.8, 6.9 and 6.10, or on material covering them, before said command will be declared or annunciated. Such an interface may advantageously also offer more options for commands than that held by the art due to a larger number of input parameters.

Said conductive members may also be used to seat or locate substrate 6.6 within the inner enclosure 6.3. Cross-sectional view along BB' shown at 6.14 illustrates this aspect, where conductive member 6.9 can be seen to fit snugly against the inner wall of enclosure 6.3. As mentioned before during the current disclosure, conductive members such as 6.8, 6.9 and 6.10 may also be used for other functions, for example as antennas to send or receive radio communication signals. For example, they may be use as radio frequency antennas for communication with BLE® or other well-known wireless technologies and standards.

It is to be appreciated that the use of inner and outer enclosures in FIG. 6A to 6C is merely exemplary and should not be construed as a limit of the present invention. For example, and single enclosure may be used by the electronic device in lieu of an outer and inner enclosure, with said push button structure located on the outside of the single enclosure and electronic parts such as members 6.6 to 6.11, and others, located inside the enclosure. The enclosure may therefore be sealed against the ingress of liquids, solids and gasses, for example is may be sealed against the ingress of water or sweat.

In addition, in the above embodiment, members 6.13 may also be replaced by a metallic snap dome structure, the latter being ubiquitous and well known in the art. In such an exemplary embodiment, member 6.4, or another member not shown, may press down on said snap dome when a user applies pressure to member 6.4. With sufficient pressure this may cause the snap dome to snap through, providing tactile feedback to the user and causing the metal of the snap dome to move measurably closer to coil 6.11.

Figure 7:
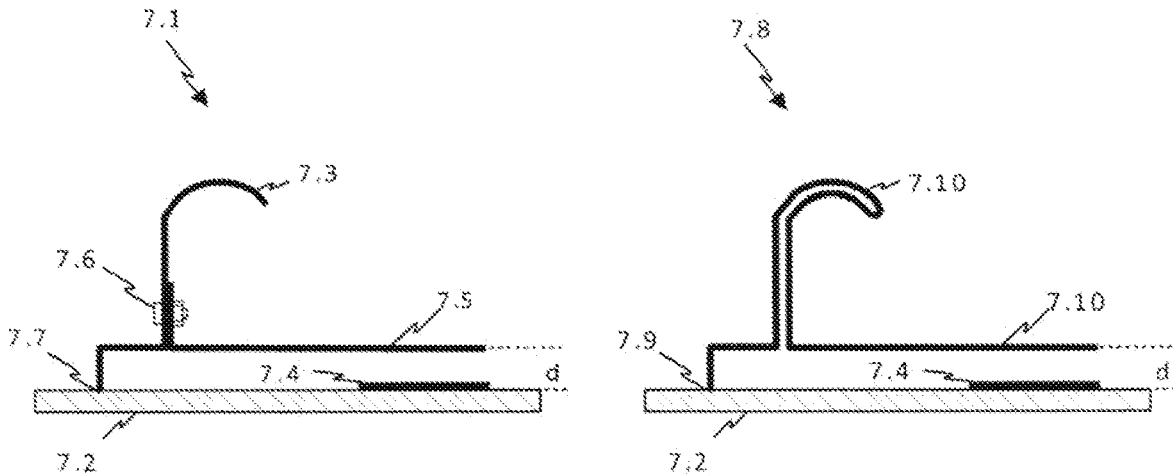
FIG. 7 shows an exemplary embodiment in the form of a
conductive member which amplifies or reduces the distance
caused by user interaction.

FIG. 7 shows two exemplary embodiments of the present invention at 7.1 and 7.8. A substrate 7.2, for example a printed circuit board, may have a conductive structure 7.4 located on it. A circuit (not shown) may measure the one or other parameter of structure 7.4 such as its inductance (self-inductance or mutual-inductance), capacitance (self-capacitance or mutual-capacitance), resistance, temperature and so forth. For example, structure 7.4 may be a coil or inductive structure of which the inductance is measured. A member 7.5 or 7.10 may be located above member 7.4 and may be fashioned out of e.g. conductive material. When a user, or other entity, causes 7.5 or 7.10 to move closer to 7.4, a change in inductance may be measured, similar to that described earlier during the current disclosure. According to the present invention, structures such as at 7.1 and 7.8 may be used to amplify the change in distance caused by a user. When a user presses on member 7.3, anchored to substrate 7.2 at 7.7, member 7.3 may deflect a first distance. However, due to the length of member 7.5 and the manner in which it is attached to 7.3, for example with fastener 7.6, the corresponding change in distance at d of member 7.5 over structure 7.4 may be much greater than said first distance. It may also be possible to decrease the corresponding change in distance at d relative to said first distance by choosing the length and position of member 7.5 correctly.

The embodiment shown at 7.8 is similar, except that a single conductive member 7.10, anchored at 7.9 to substrate 7.2, is used, wherein 7.10 is fashioned as shown, negating a need for fasteners and multiple members.

Figure 8:
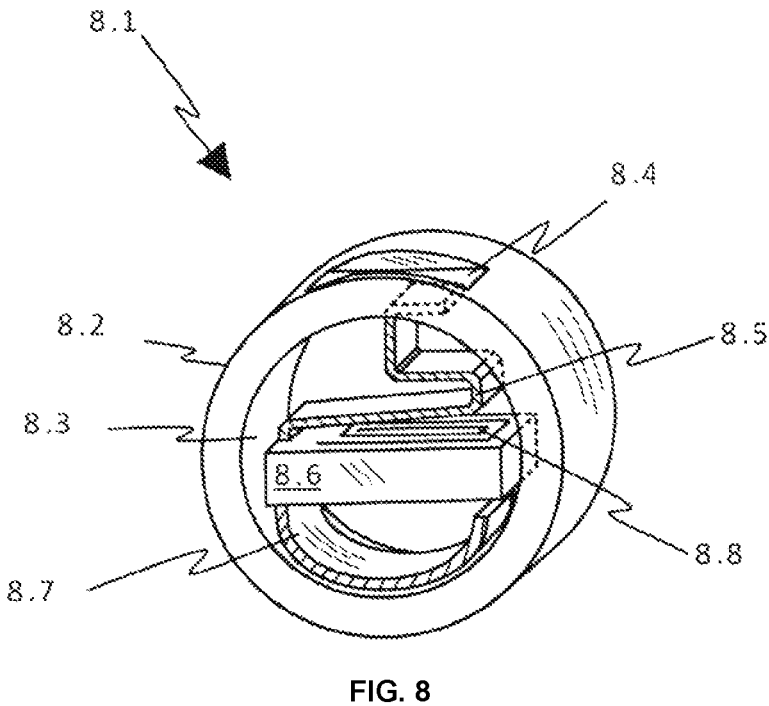
FIG. 8 shows an exemplary embodiment in the form of a
section of an electronic device enclosure using conductive
structures for multiple parameter measurements and func-
tionalities.

Capacitance measurements to discern user, or other, input may also be performed for conductive or magnetic members located over coil structures, according to the present invention. That is, a conductive or magnetic member may be pressed by a user, directly or indirectly, to cause it to move closer to or further from a coil, causing a measurable change in coil inductance, while capacitance, or another parameter, of said conductive or magnetic member may also be measured to provide additional information on user intent or other aspects. This is illustrated in exemplary manner by the embodiment shown at 8.1 in FIG. 8, where a section of the enclosure for an electronic device is shown. For example, the electronic device may a TWS earphone and the section shown may form part of the stem of said earphone. Said enclosure may have an outer surface 8.2 and inner surface 8.3, with a flexible and conductive member 8.5 located underneath an area 8.4 of the enclosure, said area being earmarked for user press inputs. A substrate 8.6, for example a printed circuit board, may be located in the enclosure, with flexible and conductive member 8.5 anchored to substrate 8.6. An inductive structure 8.8, for example a coil structure, may be present on the surface of the substrate facing said conductive member. A circuit (not shown) may measure the inductance (self-inductance or mutual-inductance) of coil 8.8. When a user presses down on area 8.4 it may deflect and cause flexible and conductive member 8.5 to move closer to coil 8.8, resulting in a measurable change in its inductance, akin to that described before. The same circuit (not shown) used to measure the inductance of coil 8.8, or another circuit (not shown), may be used to measure the capacitance (self-capacitance or mutual-capacitance) of flexible and conductive member 8.5. These capacitance measurements may be used to discern user proximity and touch events, for example.

In addition, another conductive structure 8.7 may be located on the opposite side of substrate 8.6 as shown. This conductive structure may be used to locate and seat the substrate within enclosure 8.2. It may also be used for capacitance measurements (self-capacitance mutual-capacitance) by the same circuit (not shown) used for said inductance measurements, or by another circuit (not shown). These capacitance measurements may be used in addition to, or separate from, the capacitance measurements for 8.5 to discern user proximity and touch events. In the preceding, the inductance and capacitance measurements may be performed with charge transfer circuitry and may be used in any combination to discern user input commands and intent.

Further, conductive members 8.5 and 8.7 may be a single unitary piece without departing from the current invention. That is, a single conductive member may be used for capacitance measurements to detect touch and proximity events on opposite sides of substrate 8.6 and to facilitate a user press action that influences the measured inductance of coil 8.8 by coming closer or moving further from said coil. Members 8.5 and 8.7, or said single member, may also be fashioned out of a magnetic material without departing from the present invention, with the requirement that said magnetic material has sufficient conductivity to allow the capacitance measurements.

Similar to that described earlier for FIG. 6A to 6C, conductive members 8.5 and 8.7 may also be used as radio frequency antennas to facilitate radio communication of signals to transmit voice or data. It may also be possible, according to the present invention, to use said conductive members as the antennas for distinct radio frequencies. In other words, as an example, member 8.5 may be used to communicate on one frequency and member 8.7 may be used to communicate on another frequency.

The invention claimed is:

1. An electronic device comprising a measurement circuit and an inductive structure wherein said inductive structure is formed by a first member made of an electrically conductive material that is electrically insulated or a ferrite material, a spring, a plunger which is connected to the spring, and at least a first inductor, said first inductor comprising a first coil on a first printed circuit board layer and a second coil on a second printed circuit board layer, wherein said measurement circuit is used to measure a signal related to the change in inductance of said first inductor due to a user actuation force, which causes the first member to move sequentially axially within the middle of the first and second coil of the first inductor, and which is related to the movement of the plunger and wherein said measurement circuit uses the measured change in inductance of the first inductor to discern user input commands, and wherein, in the absence of said user actuation force, the first member and the plunger are respectively returned to predetermined rest positions due to action of the spring.

2. The electronic device of claim 1, wherein the said first member comprises a rod which includes a first element made of an electrically conductive material and a second element made of a ferrite material.

3. The electronic device of claim 2, wherein at least part a part of the first element is stationary in the middle of the first coil and at least a part of the second element is stationary in the middle of the second coil of the first inductor at a predetermined rest position and produces a defined reference signal before movement of the first element caused by said user actuation force.

4. The electronic device of claim 1, wherein said measurement circuit comprises charge transfer circuitry.

5. An electronic device comprising a measurement circuit and an inductive structure wherein said inductive structure is formed by a first member that is an electrically isolated conductive member or a ferrite member, and a first inductor coil on a first printed circuit board (pcb) layer, wherein said measurement circuit is used to measure a change in inductance of said first inductor due to a user actuation force, which causes the first member to move within a middle of the first inductor coil, and wherein said measurement circuit uses the measured change in inductance of the first inductor coil to discern user input commands, said electronic device further comprising at least a second inductor coil which is positioned on a second printed circuit board (pcb) layer, and wherein said measurement circuit measures changes in inductances of the first and second inductor coils due to movement of the first member in relation to said first and second inductor coils, thereby to produce differential signals which are indicative of said user actuation force.

6. A method for implementing a user interface for controlling an electronic device comprising a measurement circuit and an inductive structure, wherein said inductive structure comprises a first member that is an electrically insulated and electrically conductive member or a ferrite member, and an inductor, said inductor comprising a first coil on a first printed circuit board layer and a second coil on a second printed circuit board layer, wherein the method comprises the steps of using the measurement circuit to measure a signal related to the change in inductance of said inductor due to a user actuation force which causes the first member to move sequentially axially within the middle of the first and second coils of the inductor, and of using the measured signal related to the change in inductance to discern user input commands.

7. The method of claim 6, wherein said first member comprises a first element which is formed using a conductive material and a second element which is made of a ferrite material.

8. The method of claim 7 including the step of using said measured signal resulting from the movement of the first element and of the second element within the first and second coils of the inductor to determine the position of the first member relative to the inductor.

9. The method of claim 6, wherein said measurement circuit comprises charge transfer circuitry and wherein said measurement steps are performed with the charge transfer circuitry.

10. A method for implementing a user interface for controlling an electronic device comprising a measurement circuit and an inductive structure, wherein said inductive structure comprises a first member that is an electrically insulated electrically conductive member or a ferrite member, and a first inductor coil, wherein the method comprises the steps of using the measurement circuit to measure a change in inductance of said first inductor coil due to a user actuation force which causes the first member to move within a middle of the first inductor coil, and wherein said electronic device further comprises at least a second inductor coil on a printed circuit board (pcb) layer and which includes the further step, upon user operation of moving the first member sequentially within the first and second inductor coils of using information from inductive measurements of the first and second inductor coils to make determinations of said user operation.

11. An electronic device comprising a measurement circuit and an inductive structure wherein said inductive structure is formed by a first member that is an electrically isolated conductive member or a ferrite member, and at least a first inductor, wherein said measurement circuit is used to measure a change in inductance of said first inductor due to a user actuation force which causes the first member to move within a middle of a coil of the first inductor, and wherein said measurement circuit uses the measured change in inductance of the coil of the first inductor to discern user input commands, wherein the said first member comprises a rod which includes a first element made of an electrically conductive material and a second element made of a ferrite material and wherein the rod is movable to a rest position at which the first element or the second element is within the coil of the first inductor and produces a defined reference signal, the electronic device further comprising a second inductor with a coil which is spaced from the coil of the first inductor, and wherein said rod is movable within the coils thereby to produce differential signals relating to environmental effects.

* * * * *